United States Patent Office 3,267,007

Patented August 16, 1966

3,267,007

BONDING METAL DEPOSITS TO ELECTRICALLY NON-CONDUCTIVE MATERIAL

Hilbert Sloan, 1380 North Ave., Elizabeth, N.J.

No Drawing. Filed Apr. 26, 1965, Ser. No. 451,074
10 Claims. (Cl. 204—15)

The invention relates to improvements in bonding a metal deposit to an electrically non-conductive material.

For many years, a poor bond between a plastic base or substrate and the deposited metal has limited the usefulness of metal coated plastics. Plastics have been electroplated for many years. Essentially, the technique involves tumbling or vapor blasting the electrically non-conductive plastic base to roughen its surface to thereby provide a mechanical anchoring site for the chemical deposition of a thin, metallic film. The chemically deposited metal film is then plated with copper, which may serve as a base for further plating with other metals. The bond produced by the mechanical roughening of the plastic base is very weak.

In recent years, chemical conditioning systems have been developed which microetch the plastic substrate. The micro etched surface provides some improvement in the bond strength of the metals plated thereon. However, peel strengths on special plating grades of ABS plastic materials are only on the order of 4 to 5 lbs./inch strip. Where the plated plastic part made by such technique is subjected to any appreciable temperature change, the plated metal separates from the plastic base because the bond is of inadequate strength to compensate for the different coefficients of expansion of the plastic base and of the metal.

Several procedures are used to make printed circuits. For one type of printed circuit, a single or double sided copper foil-plastic laminate is provided. The copper foil is bonded to the plastic board by means of heat and pressure, with or without an intermediate adhesive. The copper clad board is cut to size and the required holes are drilled through the laminate. A plating resist ink is then applied to the copper foil in the configuration of the desired circuit pattern. The copper which is not protected by the resist ink is chemically etched out and then the resist ink over the circuit runs is removed. Eyelets are then inserted into the drilled holes and crimped over to make through hole connections and to provide anchoring sites for soldering the component leads to the circuit. A printed circuit made by such procedure furnishes a peel strength of 10 to 12 lbs./inch.

Another method of making printed circuits utilizes through hole plating in lieu of eyelets. The through hole plating interconnects the circuit runs on both sides of the plastic board and allows for soldering of the component leads to the circuit runs. Through hole plating requires the steps of chemical sensitizing, chemical seeding, electroless copper deposition and finally, electroplating with copper to build up the copper plate thickness in the through hole connections. This latter sequence of operations is used in the manufacture of additive printed circuits. The bonding of the plated copper to the plastic base however has remained a serious problem, the adhesive peel strength being quite low.

More recently, printed circuits are being manufactured by a technique which involves the following procedural steps. The electrically non-conductive or plastic insulating board is cut to shape and holes are drilled therethrough for through hole connections and the soldering of leads. An adhesive composition is coated onto the board's surfaces, the adhesive generally being a solvent solution of a thermosetting resin. Various thermosetting resins have been used, and various modifying agents such as elastomers and thermoplastic resins have been included in the solution of the resin. The adhesive coating is then partialy cured to the B stage by the application of heat. The board with the partially cured resin coating is immersed in a sensitizing solution, usually stannous chloride, following which such treated board is rinsed and immersed in a seeding solution, generally palladium chloride. The board thus treated is then rinsed and immersed in an electroless copper solution where a thin copper film is deposited. The copper may also be deposited by a spray mirroring technique. A plating resist ink is then printed on both sides of the panel in the reverse of the desired circuit pattern. The exposed copper runs are then plated to a thickness of approximately 2 mils in a bright acid copper electroplating bath. The holes are plated up simultaneously. The resist is then removed in a solvent bath. The thin copper coating which is left exposed by the removal of the resist is then etched out. Finally, the assembly is placed in an oven to cure the B stage adhesive to the C stage. The foregoing method of making a printed circuit furnishes a peel strength of the copper circuit to the plastic board of only about 6 to 8 lbs./inch, and it is difficult to obtain consistent results.

It has been proposed to increase the peel strength by resorting to a special technique which involves depositing a metal film which is made sufficiently porous to expose portions of an underlying resin adhesive coating partially cured to the B stage. Such technique, however, does not provide a peel strength which is appreciably greater than the peel strength furnished by copper-foil laminated plastics bonded under heat and pressure.

Widespread use of additive printed circuits has been limited by the inability to achieve a strong bond between the copper runs and the plastic base material.

Vacuum metallizing of plastics has long been known. A lacquer base coat is applied to the base plastic. The lacquer coating serves to seal the plastic against outgassing in the vacuum chamber. The lacquer coating also furnishes a smooth surface for metallizing. The lacquer coated part is then vacuum metallized. The deposited metallic film has very little adhesion to the underlying lacquer coating. A second lacquer coating is applied over the metallic film to prevent it from being rubbed off.

The primary object of the invention is to provide a method of preparing an electrically non-conductive base or substrate with an adhesive coating which is conditioned in a manner to enable the deposition of a metal coating having a peel strength which is appreciably greater than has hitherto been accomplished.

Another object of the invention is to provide a method for adhesively bonding electrodeposited metal to an electrically non-conductive base material in a manner whereby the adhesive peel strength of the electrodeposit to the base material is substantially improved.

A further object of the invention is to provide a method of making printed circuits wherein the deposited metal is bonded to the plastic board or laminate to furnish adhesive peel strength which is substantially greater than the peel strength hitherto obtained.

Still another object of the invention is to provide a method of vacuum metallizing an electrically non-conductive base material wherein the metal deposit possesses greatly improved peel strength.

A further object of the invention is to provide a method of vacuum metallizing an electrically non-conductive base wherein treatment of an adhesive coating to adhere the metal coating to the base and the application of the metal deposit may be accomplished in the same piece of equipment to furnish a bond of metal to plastic which is on the order of five times the measure of adherence previously obtained in vacuum metallizing plastics.

These, and other objects and advantages of the invention, will be apparent from the following detailed description.

In the prior art practices which use solvent based adhesive compositions to bond a metal coating to an electrically non-conductive base, the adhesive coating is at least partially dried, and in the case of a solvent solution of a thermosetting resin the resin is at least partially cured to the B stage, before the metal coating is applied. Although the resin adhesive coating is sometimes air dried, heat is generally used to accelerate drying. In any event, a thin film or "skin" is formed on the surface of the adhesive coating prior to the application of the metal coating, or residual solvent is retained within the adhesive layer. The formation of the "skin" is due to heat activation to a greater degree of the adhesive's surface than the underlying portion of the adhesive layer. As a result, further evaporation of the internally held solvent is deterred, and diffusion of residual solvent is prevented. Thus, an adhesive layer which may appear to be dry because of the dryness at the surface has solvent entrapped therein. An adhesive coating which appears to be dry may have retained therein as much as 30 to 40% of the solvent of the adhesive composition.

It has been proposed to subject the metal coated assembly to high pressure and high temperature to complete the curing of the partially cured adhesive layer. This is done to fully cure the adhesive while forcing the parts to be joined into intimate contact with the intermediate adhesive layer. At a high curing temperature, the solvent which is retained in the adhesive layer causes blistering of the metal deposit with the resultant weakening of the bond. Even where the part is of the kind which possesses open edges, the solvent is forced to diffuse out as a gas at the open edges. Edge diffusion is inadequate to completely rid the assembly of the solvent.

I have determined that it is either the retained solvent or the skin of the B staged adhesive which interferes with the formation of a strong bond. Although a wide variety of adhesive compositions dispersed in solvents have been tried in the endeavor to select a composition which will improve the bond, it is less the particular adhesive composition than the matter of solvent retention or surface skinning which has caused poor bonding. In accordance with the invention, a variety of different thermosetting resin compositions dispersed in suitable solvents may be used. After the application of the adhesive solution to the electrically non-conductive substrate, but before the application of the metal coating, the solvent is completely driven off or eliminated in a manner whereby any curing of the thermosetting resin is inhibited or prevented. Essentially, the resin is cured from the A stage entirely over to the C stage only after the dry, solvent-free, uncured resin coating has a metal coating applied thereto. The dry, solvent-free, wholly uncured resin coated electrically non-conductive substrate may be stored at a temperature below the temperature where any curing may occur for substantial periods in readiness for metal coating. Then, after applying the metal coating, the uncured, solventless resin of the assembly is cured by applying heat.

Generally, the method of the invention comprises the following procedure. The base or substrate of electrically non-conductive material is cleaned of oil, dust, dirt, and other surface contaminants. If the base is a molded part, any mold release agent which may be present is removed. The means and agents suitable for cleaning are well-known in the art, and do not constitute a part of the present invention. The cleaned substrate is coated with a thermosetting resin adhesive composition in a vaporizable solvent. The coating may be applied by spraying, a doctor knife, a reverse roll coater, or by silk screening. The coating is applied so that when finally dried, it is approximately 1 to 2 mils thick. Preferably, the adhesive coating comprises 10 to 30% solids of a thermosetting resin, either modified or unmodified, in a suitable solvent. The curing temperature of the resin in the adhesive coating composition is selected to be below the softening point of the plastic or electrically non-conductive substrate. Also, the temperature at which the resin in the adhesive coating composition may begin to cure is above normal or room temperature; the application of heat is required at atmospheric pressure.

The adhesive coated base is then subjected to vacuum drying at a temperature sufficiently low to prevent any curing of the resin ingredient of the adhesive coating. Sufficient vacuum or negative pressure is applied to distill off, at such low temperature of drying, all of the solvent in the adhesive coating. By vacuum drying, the formation of a film or "skin" on the surface of the adhesive coating is prevented.

A thin, conductive metal film of aluminum, copper, nickel or cobalt is then deposited onto the fully dried, solvent-free, substantially wholly uncured adhesive film. The conductive metal film or coating may be deposited in any desired manner, as by vacuum metallizing aluminum, copper or nickel; or by sensitizing and seeding the dried, solvent-free, uncured adhesive and then depositing electroless copper, nickel or cobalt thereon; or by depositing copper by the copper mirroring spray technique after first sensitizing and seeding the adhesive so dried.

The electrically non-conductive base now having a metal film on the dry, solvent-free, uncured adhesive coating is subjected to heat to fully cure the resin of the adhesive coating, which up to this point has been in a substantially completely uncured state. The result is an unusually strong bond between the electrically non-conductive substrate and the deposited metal film. The assembly may now be electroplated with copper and if desired, further plated with nickel and chromium. If desired, the resin adhesive layer may be cured after plating.

Where the part is to be vacuum metallized, the same vacuum drying equipment may be used to treat the adhesive as above described and to deposit a metal film onto the treated adhesive coated part. Whether or not treatment of the adhesive coating and the metallizing operation are accomplished in the same vacuum drying and depositing equipment, an exceptionally strong bond of metal to plastic base is obtained. Applying a lacquer top coat is for the purpose of preventing oxidation of the metal deposit only, the adhesion being supplied by the intermediate resin adhesive conditioned in the manner described.

The base or substrate may be any electrically non-conductive material which will withstand the temperature of curing the thermosetting resin ingredient of the adhesive composition, and which will not be deteriorated by the solvent carrier for the thermosetting resin. Examples of suitable base materials are the cured or thermoset synthetic resins such as phenol-formaldehyde, resorcinol-formaldehyde, urea-formaldehyde, and melamine-formaldehyde, the epoxy resins, furane resins, diallylphthalate resins, polyethylene terephthalate resins and the polyesters. Such resins may be reinforced with various fibers such as glass, asbestos, or the organic fibers, and they may be provided in the form of laminates. Also, the substrate may be a metal such as steel which is coated with any one of the foregoing synthetic resins, and the coating then cured or set to an infusible state. The substrate containing the cured resin is thoroughly cleaned before applying the adhesive coating comprising a thermosetting resin in a vaporizable solvent.

The adhesive coating which is applied to the electrically non-conductive substrate is a thermosettable, curable synthetic resin dispersed in a vaporizable solvent which will not begin to cure at normal or room temperature; at atmospheric pressure, substantial heat is required to cure the resin. Preferably, the adhesive coating composition comprises a phenolic resin of the novolac type formed either with an acid or alkaline catalyst. This type of synthetic resin having 10 to 15% hexamethylene-tetramine added thereto and in an organic solvent will keep indefinitely and will cure only when heated to a range of 250 to 300° F. The ratio of phenol to formaldehyde is in a range of 1:0.8 to 1:1. Examples of suitable solvents for the curable resinous material are acetone, methyl ethyl ketone, ethylene dichloride, toluene, xylene, or mixtures thereof. Preferably, the solids content of the adhesive solution is 10 to 30% on a weight basis.

Other thermosetting resins in vaporizable solvents which may be used for the adhesive composition are urea-formaldehyde, melamine-formaldehyde, the diallylphthalates, polyethylene terphthalate, the furanes, the polyesters, and the epoxy resins, and mixtures thereof such as the phenolic epoxy resins. Whatever the thermosetting resin used, it is associated with a curing catalyst or hardening agent so that the solvent solution of the resin will not begin to cure or harden unless subjected to elevated temperatures, for example, in the range of approximately 250 to 300° F.

Where the metallized electrically non-conductive part will be subjected to elevated temperatures and the stresses of shock or vibration loading, a modifying or flexibilizing agent such as an elastomer or a thermoplastic resin is included in the adhesive composition. The inclusion of a flexibilizing agent is also desirable because of the different coefficients of expansion of the plastic base and the metal film or layer. Examples of such modifying agents are the nitrile rubbers which are rubber-like copolymers of unsaturated nitriles with dienes, preferably a copolymer of butadiene and acrylonitrile. The nitrile rubbers are compatible with phenol-formaldehyde resins and epoxy resins, forming compositions which can be cured and which furnish adhesives of high bond strength, good oil resistance and good resilience. Also, the solvent based thermosetting resin adhesive compositions may be modified with thermoplastic resins such as the vinyl resins, that is, polyvinyl chloride or a copolymer of vinyl chloride and vinyl acetate. Vaporizable solvents in which the thermosetting resin and the modifying agent may be dispersed are well-known in the art, it being only necessary that the particular thermosetting resin with or without modifying agents suitably disperse the fusible resin and elastomer or thermoplastic resin solids, and have no deleterious effect upon the substrate.

The improved bond strength of a metallized, electrically non-conductive substrate made in accordance with the invention will be apparent from the following examples. An XXXP grade phenolic laminate, after cleaning, was coated with an adhesive composition comprising 80% by weight of a copolymer of butadiene and acrylonitrile and 20% by weight of phenol-formaldehyde to provide a 30% solids solution in methyl ethyl ketone, such composition having a curing temperature of 280° F. when heated for a period of one hour. The adhesive was applied to the phenolic laminate substrate to a thickness of approximately 3 mils. The adhesive coated plastic substrate was placed in a vacuum drying oven operating at a pressure of 20 mm. of Hg and at a drying temperature of 120° F. for a period of one hour. As a result, all of the solvent was removed from the adhesive coating. At such temperature and pressure, the solvent of the adhesive composition was completely removed; also, partial curing or hardening of the elastomer modified resin was completely inhibited. The plastic substrate so coated was then metallized by applying a thin film of electroless copper, following which the copper film was plated with copper so that the total metal deposit was approximately 8 mils. Finally, the assembly was placed in a curing oven and heated to a temperature of 280° F. for one hour to cure the elastomer modified phenolic resin adhesive film of the assembly.

Peel strength tests were made on 1½ inch x 7 inch panels of XXXP board, subjected to the foregoing procedure. The adhesive coating was applied for only six inches of each panel's length. The remaining one inch was left free of adhesive. This enabled the deposited metal to be freely lifted up for the peel test. The copper deposit was cut through to the plastic board base along its long axis at ¼ inch intervals, and peel tests were made by attaching a Hunter spring mechanical force gage to the full end of the ¼ inch copper strip and pulling slowly and steadily at right angles to the plastic base. The force required to peel the copper strip from the cured adhesive layer multiplied by the factor of 4 was recorded as the adhesive peel strength per inch.

Panels coated with the adhesive, vacuum dried, metallized and plated, followed by curing as above described consistently furnished peel strength of 30 lbs./inch. The same procedure with the same adhesive composition, except that the adhesive coating was partially cured at a temperature of 190° F. for thirty minutes prior to metallizing and plating, and then completing the curing of the adhesive, furnished a peel strength of only 8 lbs./inch. The same comparative results were obtained with the electrically non-conductive substrate in the form of G10 plastic board.

With the substrate in the form of an epoxy resin coated steel plate, and with the same adhesive composition as above described subjected to vacuum drying at the pressure and temperature indicated before metallizing and plating, and only thereafter curing the modified phenolic resin of the adhesive composition, a peel strength of 20 lbs./inch was consistently obtained. With the same substrate and the same adhesive composition and where the modified synthetic resin was partially cured at atmospheric pressure before metallizing and plating, followed by completion of curing, the peel strength was only 4 lbs./inch.

It will be apparent that the method of the invention is applicable wherever it is desired to improve the strength of the bond between a metal deposit and an underlying plastic or electrically non-conductive base or substrate. To improve the bond strength of a metal film deposited by vacuum metallizing, the thermosetting resin, modified or unmodified, in a vaporizable solvent is applied to the plastic substrate in lieu of the lacquer base coat. The adhesive coating, after complete removal of the solvent, coupled with inhibition of any curing by the vacuum drying operation, and then vacuum metallizing, furnishes the considerably increased adhesive peel strength of the vacuum deposited metal to the plastic base when the completely uncured adhesive is first and entirely cured after deposition of the metal. With the method of the invention, a lacquer top coat applied to the metal film serves to prevent oxidation of the metal and for decorative purposes, and not to prevent the metal deposit from being rubbed off as when vacuum metallizing plastic material in accordance with prior art practices.

In the case of plated plastics, the method of the invention, with the significant manner of removing all solvent prior to deposition of the metal deposit on the adhesive layer, coupled with the prevention of any curing until after the metal has been deposited, furnishes the greatly improve adhesive peel strength.

The method of the invention as above described is applicable to the manufacture of additive printed circuits. After the insulating board is cut to shape, and has holes drilled therethrough for the through hole connections and soldering of leads, the adhesive coating is applied to the board's surfaces. The adhesive coated board is then placed in a vacuum drying oven to completely remove all of the solvent, while inhibiting any curing of the adhesive coating's curable ingredients. The adhesive coated board so treated, if desired, may be stored until ready for use. Then such treated board is immersed in a sensitizing solution such as stannous chloride, following which the board is immersed in a seeding solution such as palladium chloride. The adhesive coated board so treated is then immersed in a electroless copper solution where a thin copper film is deposited, or the copper may be deposited by the spray mirroring technique. With the method of the invention, the adhesive coated plastic board having the solvent completely removed and the thermosetting resin, and modifying agent if included, in a totally uncured state, may be vacuum metallized instead of sensitizing seeding and applying copper by the electroless technique or by spray mirroring. The adhesive coated and metallized board is then processed in the well-known manner of making additive printed circuits. A plating resist ink is printed on both sides of the panel in the reverse of the desired pattern. The exposed copper runs are plated up to the desired thickness in a bright acid copper electroplating bath, the holes being plated up simultaneously. The resist is removed in a solvent bath and the thin copper coating left exposed by removal of the resist is then etched out. Only after such processing is the solvent-free, wholly uncured resin of the adhesive layer hardened or cured by placing the assembly in an oven heated to the curing temperature of the resin of the adhesive layer. If desired, the plated part may be placed in a heated oven which is pressurized, thereby further improving the bond of the metal to the plastic substrate.

It is believed that the advantages and improved results of the method of the invention will be apparent from the foregoing detailed description of a preferred embodiment of the invention. It will be apparent that various modifications and changes may be made without departing from the spirit and scope of the invention as sought to be defined in the following claims.

I claim:

1. A method of bonding a metal deposit to an electrically non-conductive base comprising applying to a surface of said base an adhesive coating composition comprising a curable thermosetting resin in a vaporizable solvent, the resin being in the A stage and requiring the application of heat for curing to the C stage, subjecting the adhesive coating to vacuum drying to remove all of the solvent, the temperature of vacuum drying being sufficiently low to prevent curing of the resin of the adhesive coating, depositing metal on the solvent-free, uncured adhesive coating, and then curing the resin of the adhesive coating directly from the A stage to the C stage.

2. A method as set forth in claim 1, wherein the curable thermosetting resin of the adhesive coating composition comprises a phenol-formaldehyde and a flexibilizing agent selected from the group consisting of elastomers and thermoplastic resins.

3. A method as set forth in claim 1, wherein the metal is deposited by immersing the solvent-free, uncured adhesive coated base in an electroless metal solution.

4. A method as set forth in claim 1, wherein the metal is deposited by immersing the solvent-free, uncured adhesive coated base in an electroless metal solution, and the metal so deposited is electroplated, following which the resin of the solvent-free, uncured adhesive coating is cured to the C stage.

5. A method as set forth in claim 1, wherein the metal is deposited by vacuum metallizing.

6. A method of making printed circuits comprising providing a plastic, electrically non-conductive board, applying to a surface of said board an adhesive coating comprising a curable, thermosetting resin in a vaporizable solvent, the resin being in the A stage and requiring the application of heat for curing to the C stage, subjecting the adhesive coating to vacuum drying to remove all of the solvent, the temperature of vacuum drying being sufficiently low to prevent curing of the resin of the adhesive coating, depositing a conductive metal on the dry, solvent-free, uncured adhesive coating, then curing the resin of the adhesive coating directly from the A stage to the C stage, applying a plating resist to the metal deposit in the reverse of the desired circuit pattern, plating the exposed metal runs, removing the resist, and removing the metal left exposed by removal of the resist.

7. A method of making printed circuits comprising providing a plastic, electrically non-conductive board, applying to a surface of said board an adhesive coating comprising a curable, thermosetting resin in a vaporizable solvent, the resin being in the A stage and requiring the application of heat for curing to the C stage, subjecting the adhesive coating to vacuum drying to remove all of the solvent, the temperature of vacuum drying being sufficiently low to prevent curing of the resin of the adhesive coating, depositing a conductive metal on the dry, solvent-free, uncured adhesive coating, applying a plating resist to the metal deposit in the reverse of the desired circuit pattern, plating the exposed metal runs, removing the resist, removing the metal left exposed by removal of the resistant, and then curing the resin of the adhesive coating directly from the A stage to the C stage.

8. A method as set forth in claim 7, wherein the curable thermosetting resin of the adhesive coating composition comprises a phenol-formaldehyde and a flexibilizing agent selected from the group consisting of elastomers and thermoplastic resins.

9. A method as set forth in claim 7, wherein the conductive metal is deposited by sensitizing and seeding the dry, solvent-free uncured adhesive coating, and immersing the adhesive coated board so threated in an electroless metal solution.

10. A method as set forth in claim 7, wherein the conductive metal deposited on the dry, solvent-free, uncured adhesive coating is applied by vacuum metallizing.

References Cited by the Examiner

UNITED STATES PATENTS

| | | | |
|---|---|---|---|
| 2,703,772 | 3/1955 | Kiethly | 154—96 |
| 2,917,439 | 12/1959 | Liu | 204—22 |
| 2,941,918 | 6/1960 | West | 156—335 |
| 3,052,957 | 9/1962 | Swanson | 29—155.5 |
| 3,146,125 | 8/1964 | Schneble | 117—212 |

JOHN H. MACK, *Primary Examiner.*

T. TUFARIELLO, *Assistant Examiner.*